(12) United States Patent
Goto (10) Patent No.: US 7,920,189 B2
(45) Date of Patent: Apr. 5, 2011

(54) SOLID-STATE IMAGING DEVICE (75) Inventor: Takashi Goto, Kanagawa (JP)

(73) Assignee: Fujifilm Corporation, Tokyo (JP)

(\*) Notice: Subject to any disclaimer, the term of this patent is extended or adjusted under 35 U.S.C. 154(b) by 494 days.

(21) Appl. No.: 12/048,374

(22) Filed: Mar. 14, 2008

(65) Prior Publication Data

US 2008/0225142 A1 Sep. 18, 2008

(30) Foreign Application Priority Data

Mar. 16, 2007 (JP) ................. 2007-068587

(51) Int. Cl.
- H04N 9/083 (2006.01)
- H04N 3/14 (2006.01)
- H04N 5/335 (2006.01)
- H04N 9/04 (2006.01)
- H04N 5/225 (2006.01)
- H01L 27/00 (2006.01)
- H01L 27/146 (2006.01)
- H01L 31/062 (2006.01)
- H01L 31/113 (2006.01)
- H01L 31/0232 (2006.01)

(52) U.S. Cl. ............... 348/273; 348/340; 250/208.1; 257/258; 257/294; 257/432

(58) Field of Classification Search ............ 348/272, 348/273, 280–2, 340; 250/208.1; 257/53–56, 257/184, 187, 225, 229–231, 257–8, 291–4, 257/432, 440; 438/70
See application file for complete search history.

(56) References Cited

U.S. PATENT DOCUMENTS

| 5,453,611 | A | 9/1995 | Oozu et al. |
| 7,196,391 | B2 * | 3/2007 | Hsieh ............... 257/444 |
| 7,667,755 | B2 * | 2/2010 | Misawa ............ 348/308 |
| 2007/0008539 | A1 | 1/2007 | Hirano et al. |
| 2007/0120045 | A1 | 5/2007 | Yokoyama |
| 2007/0298164 | A1 * | 12/2007 | Ogata et al. ............ 427/162 |
| 2008/0035835 | A1 | 2/2008 | Komatsu et al. |

FOREIGN PATENT DOCUMENTS

| JP | 59-078567 | 5/1984 |
| JP | 60042989 | 3/1985 |
| JP | 5291549 | 5/1993 |

(Continued)

OTHER PUBLICATIONS

Japanese Office Action, dated Aug. 31, 2010 for JP 2008-56692 with partial English translation.

*Primary Examiner* — Sinh Tran
*Assistant Examiner* — Daniel M Pasiewicz
(74) *Attorney, Agent, or Firm* — Sughrue Mion, PLLC (57) ABSTRACT

A solid-state imaging device comprising a plurality of pixel parts each capable of obtaining one color signal, said plurality of pixel parts being arranged in the same plane, wherein each of the pixel parts comprises: a photoelectric conversion element comprising a lower electrode formed on or above a substrate, an upper electrode formed above the lower electrode and a photoelectric conversion film sandwiched between the lower electrode and the upper electrode; and a color filter formed on or above the upper electrode, wherein d<p where d is a distance from a lower face of the photoelectric conversion film to an upper face of the color filter and p is an arrangement pitch of the photoelectric conversion element.

20 Claims, 5 Drawing Sheets

FOREIGN PATENT DOCUMENTS

| | | |
|---|---|---|
| JP | 6204445 | 7/1994 |
| JP | 2002-502120 A | 1/2002 |
| JP | 2004179266 | 6/2004 |
| JP | 2004296458 | 10/2004 |
| JP | 2006186118 | 7/2006 |
| JP | 200759834 | 3/2007 |
| JP | 200767194 | 3/2007 |
| JP | 200842122 | 2/2008 |

* cited by examiner

SOLID-STATE IMAGING DEVICE

BACKGROUND OF THE INVENTION

1. Field of the Invention

This invention relates to a solid-state imaging device wherein a plurality of pixel parts each capable of providing one color signal are arranged in the same plane.

2. Description of the Related Art

JP-T-2002-502120 discloses a solid-state imaging device of a configuration wherein a lower electrode is formed on a silicon substrate, a photoelectric conversion film made of an organic photoelectric conversion material is formed on the lower electrode, upper electrodes divided each for each pixel are formed on the photoelectric conversion film, and color filters divided for each pixel are formed on the upper electrodes in a one-to-one correspondence. According to such a solid-state imaging device, the light reception area of each pixel can be increased and higher sensitivity can be expected as compared with a single-plate solid-state imaging device which is mainstream at present. The whole silicon substrate can be used for a read circuit of a signal responsive to a charge occurring in the photoelectric conversion film, so that it is made possible to increase the number of pixels without sticking to microminiaturization of a circuit.

However, in the described solid-state imaging device, if there is incident light in a slanting direction, there is a possibility that light passing through the color filter of one pixel may be incident on the photoelectric conversion film of a pixel adjacent to that pixel, causing a color mixture to occur. If a microlens is provided on the color filter, fear of color mixture is reduced. In this case, however, problems of the microlens forming cost, an increase in the thickness as much as that of the microlens, occurrence of brightness shading caused by the microlens, etc., occur.

SUMMARY OF THE INVENTION

It is therefore an object of the invention to provide a solid-state imaging device including photoelectric conversion elements and color filters above a substrate for making it possible to prevent a color mixture caused by incident light in a slanting direction without providing any microlens on the top part.

A solid-state imaging device of the invention is a solid-state imaging device comprising a plurality of pixel parts each capable of obtaining one color signal, said plurality of pixel parts being arranged in the same plane, wherein each of the pixel parts comprises: a photoelectric conversion element comprising a lower electrode formed on or above a substrate, an upper electrode formed above the lower electrode and a photoelectric conversion film sandwiched between the lower electrode and the upper electrode; and a color filter formed on or above the upper electrode, wherein d<p where d is a distance from a lower face of the photoelectric conversion film to an upper face of the color filter and p is an arrangement pitch of the photoelectric conversion element.

In the solid-state imaging device of the invention, the photoelectric conversion film comprises an organic photoelectric conversion material.

In the solid-state imaging device of the invention, the photoelectric conversion film comprises an inorganic crystalline semiconductor material of direct transition type.

In the solid-state imaging device of the invention, the photoelectric conversion film has a thickness of smaller than 3 μm.

In the solid-state imaging device of the invention, the arrangement pitch p is less than 3 μm. In the solid-state imaging device of the invention, the photoelectric conversion film has a light absorption factor of 50% or more in wavelength 400 nm to 700 nm.

In the solid-state imaging device of the invention, each of the pixel parts further comprises a protective film that protects the photoelectric conversion element, the protective film being between the upper electrode and the color filter, and the protective film has a light transmittance of 80% or more in wavelength 400 nm to 700 nm.

In the solid-state imaging device of the invention, the protective film is formed according to an atomic layer deposition (ALD) method.

In the solid-state imaging device of the invention, a material of the protective film comprises a metal oxide.

In the solid-state imaging device of the invention, the metal oxide is $Al_2O_3$.

In the solid-state imaging device of the invention, each of the pixel parts further comprises an additional protective film between the protective film and the color filter or between the protective film and the upper electrode, and the additional protective film comprises a high molecular compound.

In the solid-state imaging device of the invention, the high molecular compound is a para-xylylene-based resin.

In the solid-state imaging device of the invention, the upper electrode comprises any of an indium tin oxide, an indium oxide, a tin oxide, or a zinc oxide.

In the solid-state imaging device of the invention, the color filters contained in said plurality of pixel parts are primary color filters.

In the solid-state imaging device of the invention, the color filters contained in said plurality of pixel parts are complementary color filters.

In the solid-state imaging device of the invention, said plurality of pixel parts comprise three or more pixel parts, and the complementary color filters are of: three types of yellow, cyan and magenta; three types of yellow, cyan and transparent; three types of yellow, transparent and magenta; three types of transparent, cyan and magenta; or four types of yellow, cyan, magenta and transparent.

In the solid-state imaging device of the invention, the color filter comprises metal particles.

In the solid-state imaging device of the invention, the metal particles are gold particles or sliver particles.

In the solid-state imaging device of the invention, the photoelectric conversion film is a common film in the pixel parts.

In the solid-state imaging device of the invention, the lower electrode comprises a light entry prevention part that prevents light incident and reflected from entering an adjacent pixel part.

DETAILED DESCRIPTION OF THE INVENTION

Referring now to the accompanying drawings, there is shown an embodiment of the invention.

Figure 1:
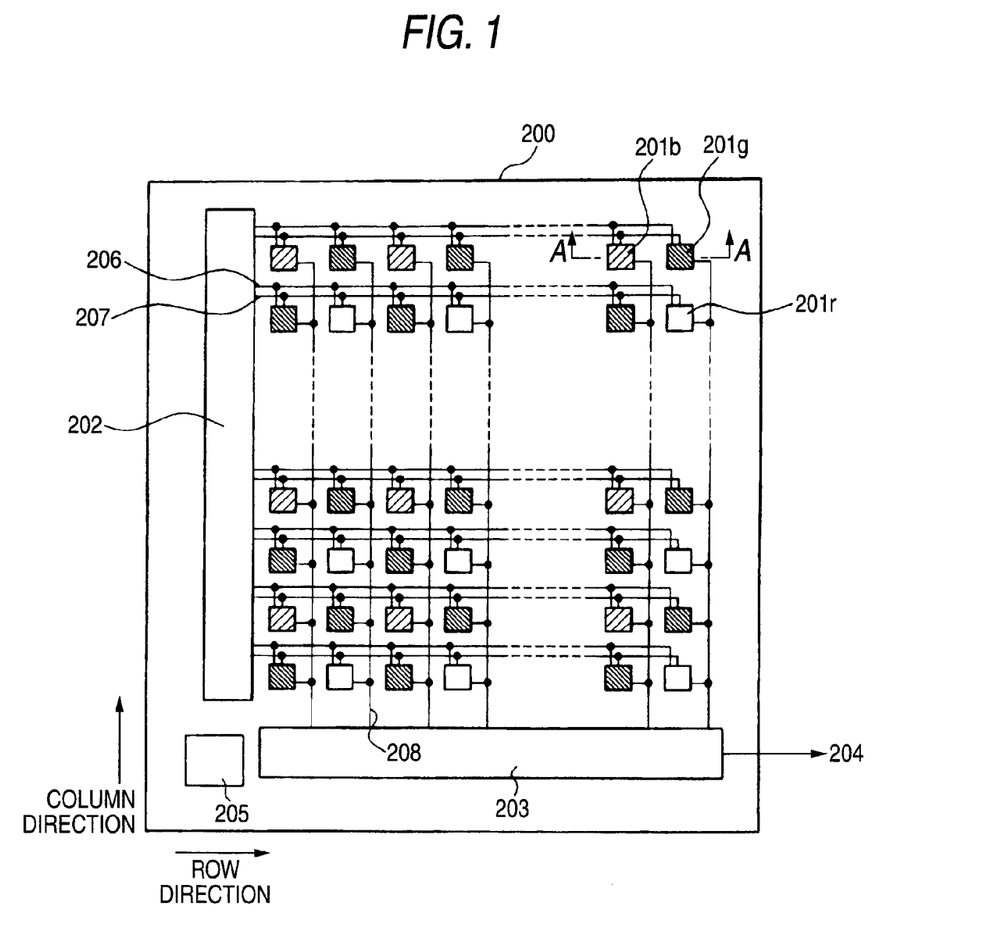
FIG. 1 is a surface schematic drawing to show the configuration of a solid-state imaging device to describe an embodiment of the invention.
Figure 2:
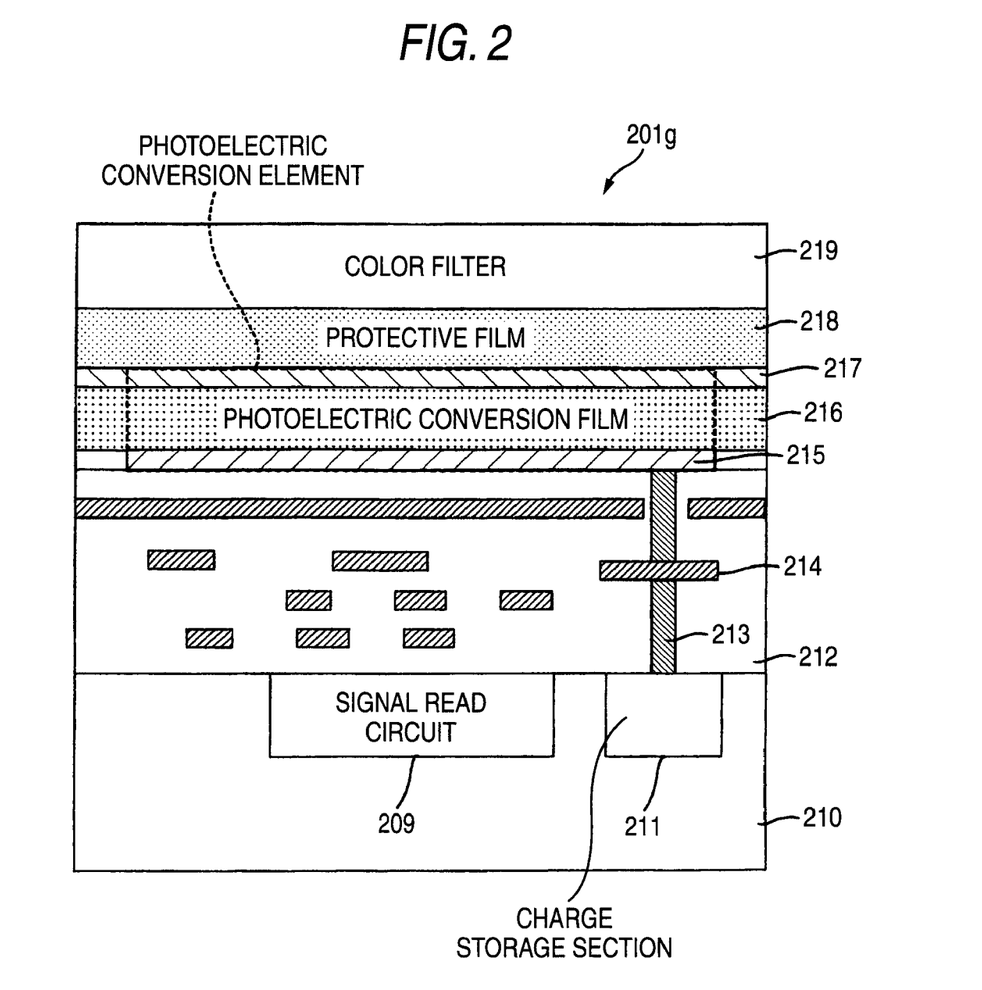
FIG. 2 is a sectional schematic drawing of one pixel part of the solid-state imaging device in FIG. 1.

FIG. 1 is a surface schematic drawing to show the configuration of a solid-state imaging device to describe an embodiment of the invention. FIG. 2 is a sectional schematic drawing of one pixel part of the solid-state imaging device in FIG. 1.

A solid-state imaging device 200 shown in FIG. 1 includes a large number of pixel parts (201r, 201g, 201b) arranged like a tetragonal lattice in a row direction and a column direction orthogonal to the row direction in the same plane. The many pixel parts contain three types of pixel parts 201r for providing a color signal of a red component, pixel parts 201g for providing a color signal of a green component, and pixel parts 201b for providing a color signal of a blue component. As arrangement of the many pixel parts, a bg pixel part row of an alternating pattern of the pixel parts 201b and 201g in the row direction and a gr pixel part row of an alternating pattern of the pixel parts 201g and 201r in the row direction are arranged alternately in the column direction.

The solid-state imaging device 200 includes a row selection scanning section 202 for supplying a drive signal for driving a signal read circuit 209 contained in each pixel part to the signal read circuit 209, a signal processing section 203 for performing signal processing of correlated double sampling processing, A/D conversion processing, etc., for a color signal output from the signal read circuit 209 of each pixel part, and a control section 205 for generating a timing pulse for driving each pixel part, supplying the timing pulse to each pixel part, and controlling the row selection scanning section 202 and the signal processing section 203.

The signal read circuits 209 of the pixel parts 201r, 201g, and 201b are connected to the row selection scanning section 202 via two types of signal lines (reset signal line 206 and row selection signal line 207). A drive signal is supplied to the signal read circuit 209 from the row selection scanning section 202, whereby the signal read operation of the signal read circuit 209 is controlled.

The signal read circuits 209 of the pixel parts 201r, 201g, and 201b are connected to the signal processing section 203 via a signal output line 208. A color signal output from the signal read circuit 209 is transferred to the signal processing section 203 via a signal output line 208.

Each pixel part of the solid-state imaging device 200 is made up of a lower electrode 215 formed through an insulating film 212 above a substrate 210, a photoelectric conversion film 216 formed on the lower electrode 215, an upper electrode 217 formed on the photoelectric conversion film 216, a protective film 218 formed on the upper electrode 217, and a color filter 219 formed on the protective film 218 as shown in FIG. 2. The lower electrode 215, the upper electrode 217, and the photoelectric conversion film 216 sandwiched therebetween make up a photoelectric conversion element.

The upper electrode 217 is formed of a conductive material transparent to incident light because it needs to allow light to be incident on the photoelectric conversion film 216. A transparent conducting oxide (TCO) having high transmittance of visible light and a low resistance value can be used as a material of the upper electrode 217. A metal thin film of Au, etc., can also be used. However, if an attempt is made to obtain transmittance 90% or more, the resistance value grows extremely and thus the TCO is preferred. As the TCO, particularly ITO, $In_2O_3$, $SnO_2$, ZnO, AZO, FTO, $TiO_2$, $ZnO_2$, etc., can be used preferably; among them, ITO is most preferable from the viewpoint of process simplicity, low resistance properties, and transparency. The upper electrode 217 is formed of one layer common to all pixel parts, but may be divided each for each pixel part.

The lower electrode 215 is a thin film divided for each pixel part and is formed of a transparent or opaque conductive material. Metal of Cr, In, Al, Ag, etc., or TCO can be used as a material of the lower electrode 215.

The photoelectric conversion film 216 contains a photoelectric conversion material for absorbing light of a specific wave range and generating a charge responsive to the light. The photoelectric conversion film 216 is formed of one layer common to all pixel parts, but may be divided each for each pixel part. Since the solid-state imaging device 200 executes spectral diffraction in each pixel part through the color filter 219, the photoelectric conversion film 216 is formed of a material having an absorption spectrum high in absorption factor throughout the visible region. It is desirable that the photoelectric conversion film 216 should use a material also high in quantum efficiency to maintain high sensitivity. An increase in the film thickness to increase the light absorption factor leads to degradation of the quantum efficiency. Thus, preferably sufficient light can be absorbed with a thinner film thickness using a material having a large absorption coefficient.

The photoelectric conversion film 216 uses a material such that the light absorption factor in wavelength 400 nm to 700 nm is 50% or more, whereby it is made possible to provide image quality to such an extent that no problem occurs in photographing. For example, an organic semiconductor, an organic material containing an organic pigment, and an inorganic semiconducting crystal, etc., having a large absorption coefficient having a band gap of direct transition type are used singly or in combination, whereby it is made possible to create a photoelectric conversion film with the light absorption factor in wavelength 400 nm to 700 nm becoming 50% or more.

The photoelectric conversion element contained in each pixel part may contain at least the lower electrode 215, the photoelectric conversion film 216, and the upper electrode 217. In such a photoelectric conversion element, a predetermined bias voltage can be applied to the portion between the upper electrode 217 and the lower electrode 215, thereby moving one of hole and electron of charge occurring in the portion of the photoelectric conversion film 216 sandwiched between the lower electrode 215 and the upper electrode 217 to the upper electrode 217 and the other to the lower electrode 215. In the embodiment, it is assumed that wiring is connected to the upper electrode 217 and a bias voltage is applied through the wiring to the upper electrode 217. It is also assumed that the polarity of the bias voltage is determined so that the hole occurring in the photoelectric conversion film 216 moves to the upper electrode 217 and the electron moves to the lower electrode 215; however, the polarity may be opposite.

In the photoelectric conversion element contained in each pixel part, a function film for improving the function of the photoelectric conversion element (for example, a charge blocking layer for suppressing a dark current) can also be provided between the lower electrode 215 and the photoelectric conversion film 216, between the upper electrode 217 and the photoelectric conversion film 216, or in both.

Formed in the substrate 210 below the lower electrode 215 of the pixel part are a charge storage section 211 for storing the charge moved to the lower electrode 215 and the signal read circuit 209 for converting the charge stored in the charge storage section 211 into a voltage signal and outputting the voltage signal in association with the lower electrode 215. The substrate 210 may be a substrate in which and on which an electronic circuit can be installed, such as a glass substrate or a quartz substrate as well as a semiconductor substrate of silicon, etc.

The charge storage section 211 is electrically connected to the lower electrode 215 by a plug 213 of a conductive material formed piercing the insulating film 212, whereby the charge collected in the lower electrode 215 can be moved to the charge storage section 211. The signal read circuit 209 is formed of a known CMOS circuit or CCD.

Buried in the insulating film 212 are a shading film for preventing light from falling on the charge storage section 211 and the signal read circuit 209, and wiring 214 of the reset signal line 206, the row selection signal line 207, the signal output line 208, etc., in addition to the plug 213.

The color filter 219 is divided for each pixel part and is formed of a different material for each pixel part. For the pixel part 201r, the color filter 219 is a known color filter for transmitting red light; this color filter is called color filter 219r. For the pixel part 201g, the color filter 219 is a known color filter for transmitting green light; this color filter is called color filter 219g. For the pixel part 201b, the color filter 219 is a known color filter for transmitting blue light; this color filter is called color filter 219b. Thus, the color filter 219 needs to be formed as it is divided for each pixel part, and to form the color filter, a known method used with a single-plate solid-state imaging device, etc., can be used.

For the solid-state imaging device 200, after the photoelectric conversion elements of the pixel parts are formed, the color filters 219r, 219g, and 219b are formed according to a photolithography step and a bake step. When the photolithography step and the bake step are executed with the photoelectric conversion film 216 covered only with the upper electrode 217, if an organic photoelectric conversion material is used as a material of the photoelectric conversion film 216, the characteristic of the photoelectric conversion film 216 is degraded. There is a possibility that moisture or oxygen may enter the photoelectric conversion film 216 still after the color filters 219r, 219g, and 219b are formed, and accordingly the performance of the photoelectric conversion film 216 may be degraded. Then, the solid-state imaging device 200 is provided with the protective film 218 to prevent the characteristic degradation caused by such manufacturing steps and age-based degradation of the photoelectric conversion film 216 caused by moisture, oxygen, etc.

The protective film 218 is a thin film of a material having both the protection function of the photoelectric conversion film 216 (denseness for making moisture or oxygen hard to enter) and transparency. The protective film 218 can allow sufficient visible light to be incident on the photoelectric conversion film 216 if the light transmittance in wavelength 400 nm to 700 nm is 80% or more.

Preferably, the protective film 218 is provided by forming a film using an inorganic material by an ALCVD method. The ALCVD method, which is an atomic layer CVD method, can form a dense inorganic film, which can become an effective protective film of the photoelectric conversion film 216. The ALCVD method is also known as an ALE method or an ALD method. Preferably, the inorganic material to form a film by an ALCVD method is an inorganic oxide (for example, $Al_2O_3$, $SiO_2$, $TiO_2$, $ZrO_2$, MgO, $HfO_2$, $Ta_2O_5$); among them, $Al_2O_3$ is the most effective.

To more enhance the protection performance of the photoelectric conversion film 216, an additional protective film may be provided on or under the protective film 218. In this case, preferably the additional protective film is a high molecular compound. If the protective film 218 is a metal oxide formed by the ALD method, preferably a para-xylylene-based resin having high drape with the protective film 218 is used as the high molecular compound. A structure wherein another protective film is provided on the protective film 218 provides a particularly high protection effect of photoelectric conversion layer 9.

In the described solid-state imaging device 200, red light of incident light is absorbed in the photoelectric conversion film 216 of the pixel part 201r and is converted into a charge, which is then stored in the charge storage section 211 and then is output as a red signal by the signal read circuit 209. Green light of incident light is absorbed in the photoelectric conversion film 216 of the pixel part 201g and is converted into a charge, which is then stored in the charge storage section 211 and then is output as a green signal by the signal read circuit 209. Blue light of incident light is absorbed in the photoelectric conversion film 216 of the pixel part 201b and is converted into a charge, which is then stored in the charge storage section 211 and then is output as a blue signal by the signal read circuit 209. Thus, the red signal, the green signal, and the blue signal are output by picking up an image from the solid-state imaging device 200, so that it is made possible to generate color image data by performing known signal processing.

Figure 3:
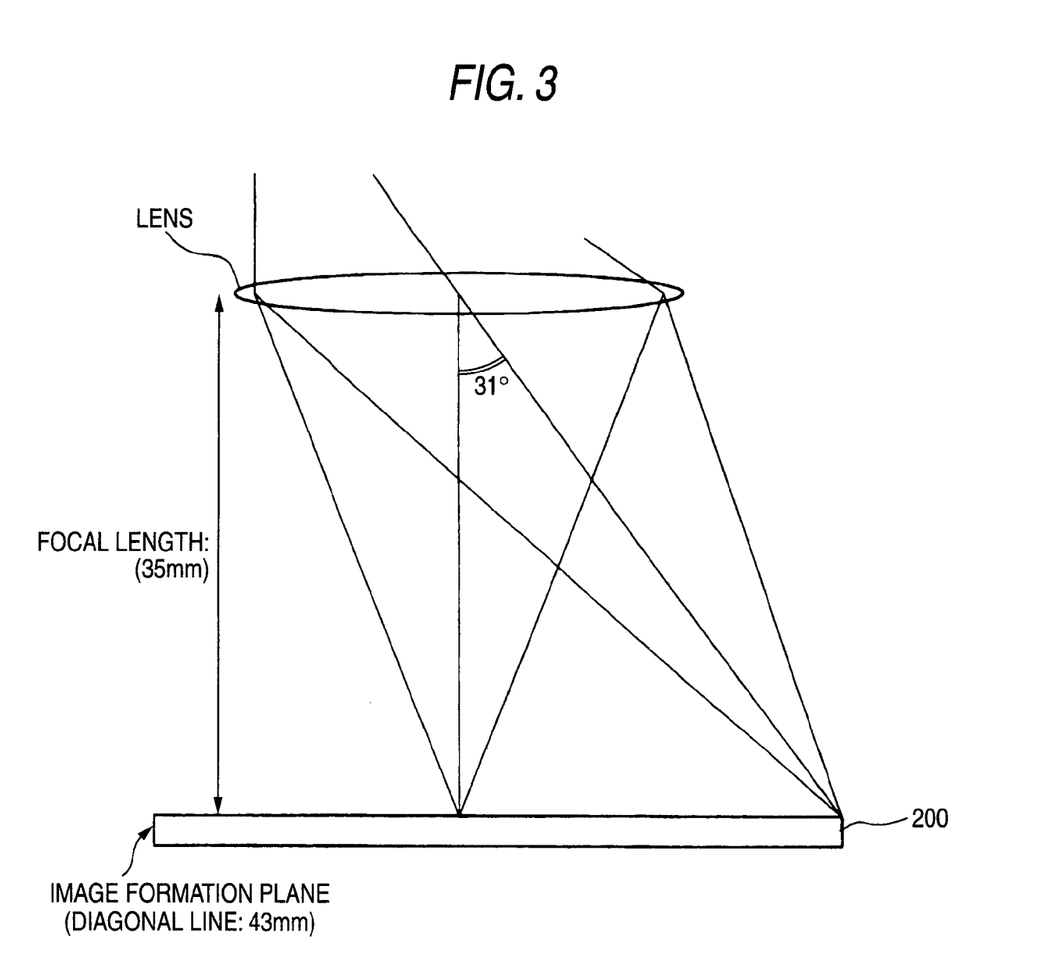
FIG. 3 is a drawing to show an incidence state of light on the solid-state imaging device for picking up an image with the solid-state imaging device of the embodiment using a lens having a focal length of 35 mm.
Figure 4:
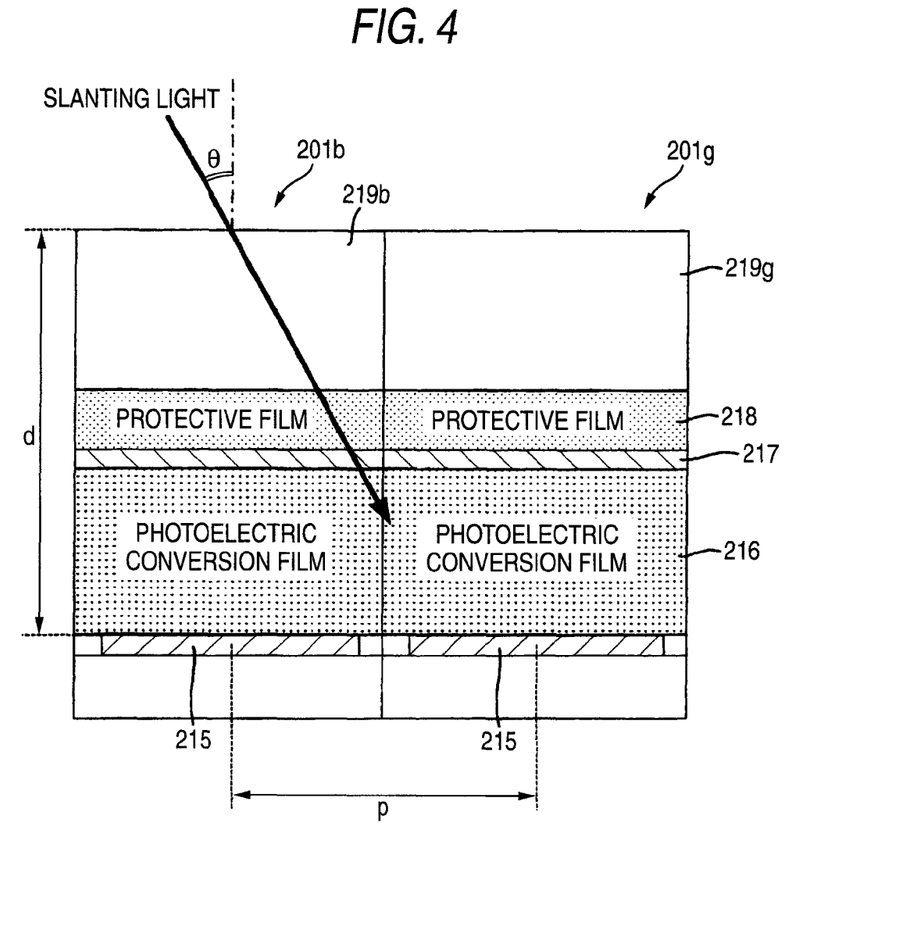
FIG. 4 is a sectional schematic drawing taken on line A-A in FIG. 1.

In the described solid-state imaging device 200, occurrence of a phenomenon in which light incident on one pixel part in a slanting direction is incident on the photoelectric conversion film 216 of the pixel part adjacent to that pixel part, namely, a color mixture introduces a problem, as described above. The solid-state imaging device 200 is devised so as to prevent the color mixture and this point will be discussed below:

FIG. 3 is a drawing to show an incidence state of light on the solid-state imaging device for picking up an image with the solid-state imaging device of the embodiment using a lens having a focal length of 35 mm. FIG. 4 is a sectional schematic drawing taken on line A-A in FIG. 1. In FIG. 4, the portion below the lower electrode is not shown.

As shown in FIG. 3, if the size of the solid-state imaging device 200 which is a general optical system is 36 mm×24 mm (diagonal line 43 mm), light is incident on the pixel part vertically at the center of the solid-state imaging device 200; while, light is incident on the pixel part with an inclination of about 31° at an end part of the solid-state imaging device 200. Thus, letting the distance from the lower face of the photoelectric conversion film 216 to the upper face of the color filter 219 be d and the arrangement pitch of the photoelectric conversion element contained in the pixel part (the same as the arrangement pitch of the lower electrode 215) be p, if d is larger than p, light incident on the pixel part 201b at an end part of the solid-state imaging device 200 at incidence angle θ=31° arrives at the photoelectric conversion film 216 of the pixel part 201g adjacent to the pixel part 201b as shown in FIG. 4, causing a color mixture to occur. Since light to be subjected to photoelectric conversion in the pixel part 201b enters another pixel part, the sensitivity of the pixel part 201b lowers. Then, to prevent such a color mixture and sensitivity lowering, the relation of d<2×p×tan θ (θ=31°), namely, the relation of d<p needs to hold true. In the solid-state imaging device 200, the materials, the thicknesses, etc., from the photoelectric conversion film 216 to the color filter 219 are set so that the relation of d<p holds true.

If the relation is satisfied, as the value of p is lessened with microminiaturization of the pixel part, the value of d needs to be lessened accordingly. Thus, preferably materials capable of lessening the value of d are selected as the materials from the photoelectric conversion film 216 to the color filter 219 of each pixel part of the solid-state imaging device 200.

For example, preferably a color filter using metal particles for thinning the film thickness as compared with conventional organic color filters is used as the color filter 219. Particularly, gold particles and sliver particles are easy to perform spectral control and thus it is made possible to realize a thin color filter easy to manufacture by using a color filter using the particles. Also preferably, the color filter 219 is made a complementary color filter whose thickness can be thinned as compared with a primary color filter.

When the number of types of pixel parts of the solid-state imaging device 200 is three, it is considered that three types of complementary color filters used with the solid-state imaging device 200 are, for example, three types of (yellow, cyan, magenta), three types of (yellow, cyan, transparent), three types of (yellow, transparent, magenta), or three types of (transparent, cyan, magenta). When the number of types of pixel parts of the solid-state imaging device 200 is four, it is considered that four types of complementary color filters used with the solid-state imaging device 200 are, for example, four types of (yellow, cyan, magenta, transparent). The arrangement of the pixel parts when the complementary color filters are used may be determined as required so that color image data can be generated.

Preferably, a material having a thin thickness and a large light absorption factor is used for the photoelectric conversion film 216. An organic semiconductor or an inorganic crystalline semiconductor of direct transition type can be preferably used as a photoelectric conversion material having a large light absorption factor although it is thin.

Table 1 lists the relationship between the film thickness and the light absorption factor of each material when red light having a wavelength of 650 nm is made incident on an organic semiconductor having an absorption factor of about 170000/cm and crystalline silicon having an absorption factor of about 3000/cm as the photoelectric conversion materials. Table 2 lists the relationship between the film thickness and the light absorption factor of each material when red light having a wavelength of 650 nm is made incident on $CuInSe_2$ (an example of inorganic crystalline semiconductor of direct transition type) having an absorption factor of about 115000/cm and crystalline silicon having an absorption factor of about 3000/cm as the photoelectric conversion materials.

TABLE 1

| | Film thickness required for absorption | |
|---|---|---|
| Absorption factor | Organic semiconductor | Crystalline silicon |
| 50% | 41 nm | 2.2 μm |
| 60% | 54 nm | 3.0 μm |
| 70% | 70 nm | 3.9 μm |
| 80% | 95 nm | 5.2 μm |
| 90% | 135 nm | 7.4 μm |

TABLE 2

| | Film thickness required for absorption | |
|---|---|---|
| Absorption factor | $CuInSe_2$ | Crystalline silicon |
| 50% | 60 nm | 2.2 μm |
| 60% | 80 nm | 3.0 μm |
| 70% | 105 nm | 3.9 μm |
| 80% | 140 nm | 5.2 μm |
| 90% | 200 nm | 7.4 μm |

From Tables 1 and 2, when the thickness of the photoelectric conversion film 216 is smaller than 3 μm, if crystalline silicon is used as the material of the photoelectric conversion film 216, the photoelectric conversion film 216 can absorb only light of 60% or less and therefore a color mixture and sensitivity lowering become conspicuous.

Therefore, with crystalline silicon of the relate-art general material, if the film thickness falls below 3 μm, sufficient light absorption cannot be conducted. On the other hand, in view of the optical system, d must be set to less than p (d<p) as described above. That is, with the crystalline silicon, it is necessary that the film thickness has a thickness of 3 μm or more so as to conduct sufficient light absorption, due to which d>3 μm, and therefore p>3 μm. Accordingly, it is difficult to the integration ratio of the pixel parts.

However, the film thickness can be made thinner than 3 μm by creating the photoelectric conversion film using a material having a high absorption coefficient. The content that it is possible to make the film thickness be thinner than 3 μm leads to the content that it is possible to make d be less than 3 μm. Accordingly, the value of the arrangement pitch p of the photoelectric conversion element described above can be also set to less than 3 μm (p<3 μm) and consequently it is made possible to increase the integration ratio of the pixel parts. The preferred material of the protective film 218 and the material of another protective film provided on or under the protective film 218 are materials capable of sufficiently maintaining the protection performance of the photoelectric conversion film 216 although the thickness is thin. Thus, use of the materials is also advantageous for lessening the value of d.

Figure 5:
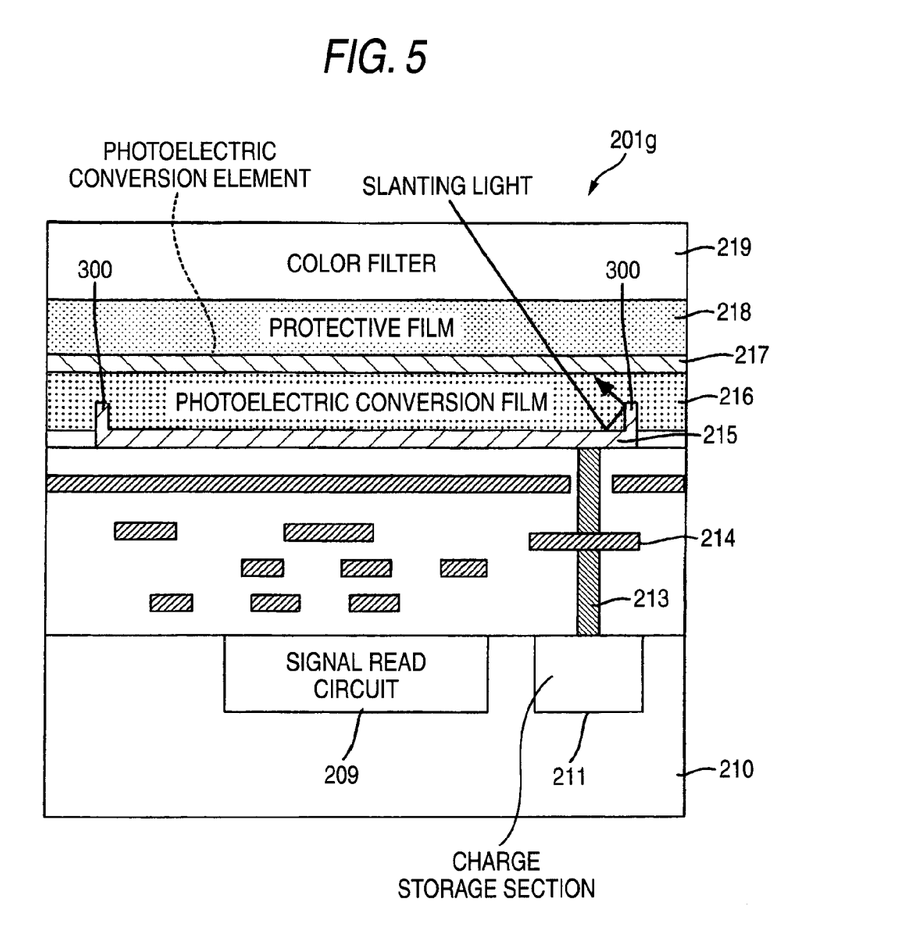
FIG. 5 is a drawing to show a modified example of a pixel part of the solid-state imaging device shown in FIG. 1.

FIG. 5 is a drawing to show a modified example of the pixel part of the solid-state imaging device 200 shown in FIG. 1. Components identical with those previously described with reference to FIG. 1 are denoted by the same reference numerals in FIG. 5.

Preferably, the value of the arrangement pitch p of the photoelectric conversion element described above is set to less than 3 μm (p<3 μm).

The pixel part shown in FIG. 5 has projection parts 300 provided on the tops of the end parts of the lower electrode 215 as light entry prevention parts to prevent light incident on the lower electrode 215 of the pixel part shown in FIG. 1 in a slanting direction from reflecting therefrom and entering the photoelectric conversion film 216 of an adjacent pixel part. The projection parts 300 are formed of the same material as the lower electrode 215. This configuration makes it possible to prevent a color mixture caused as light reflected on the lower electrode 215 enters the photoelectric conversion film 216 of an adjacent pixel part.

In the embodiment, since the photoelectric conversion film 216 is a common film in all pixel parts, it is impossible to provide an opaque insulating layer, etc., between the photoelectric conversion films 216 of the pixel parts for preventing the light reflected on the lower electrode 215 from arriving at the photoelectric conversion film 216 of the adjacent pixel part. Thus, providing the projection parts 300 as shown in FIG. 5 becomes effective for preventing a color mixture in the element having the photoelectric conversion films 216 of a common film.

A color mixture can be caused not only by slanting light passing through the photoelectric conversion film 216 of any pixel part and leaking to the photoelectric conversion film 216 of the adjacent pixel part as shown in FIG. 4, but also by slanting light passing through a component above the photoelectric conversion film 216 of the adjacent pixel part and leaking from here to the photoelectric conversion film 216 of the adjacent pixel part.

If the photoelectric conversion film 216 is divided for each pixel part, an opaque insulating layer, etc., can be provided between the photoelectric conversion films 216 of the pixel parts and therefore only the slanting light from the component above the photoelectric conversion film 216 introduces a problem. However, if the photoelectric conversion film 216 is a common film in all pixel parts, in addition to the slanting light from the component above the photoelectric conversion film 216, slanting light from the adjacent photoelectric conversion film 216 also introduces a problem and thus the effect of the color mixture becomes larger.

Therefore, the advantage of color mixture prevention by setting d<p becomes more noticeable if the photoelectric conversion film 216 is a common film in all pixel parts. Thus, according to the solid-state imaging device 200, the photoelectric conversion film 216, the upper electrode 217, the protective film 218, and the color filter 219 are designed so that the relation of d<p holds true, so that a color mixture and sensitivity lowering caused by incident light in the slanting direction can be prevented without providing any microlens. Thus, an imaging device capable of photographing with high image quality can be provided without producing problems of the microlens forming cost, an increase in the thickness as much as that of the microlens, occurrence of brightness shading caused by the microlens, etc.

According to the invention, there can be provided a solid-state imaging device including photoelectric conversion elements and color filters above a substrate for making it possible to prevent a color mixture caused by incident light in a slanting direction without providing any microlens on the top part.

The entire disclosure of each and every foreign patent application from which the benefit of foreign priority has been claimed in the present application is incorporated herein by reference, as if fully set forth.

What is claimed is:

1. A solid-state imaging device comprising a plurality of pixel parts each capable of obtaining one color signal, said plurality of pixel parts being arranged in the same plane,
    wherein each of the pixel parts comprises:
    a photoelectric conversion element comprising a lower electrode formed on or above a substrate, an upper electrode formed above the lower electrode and a photoelectric conversion film sandwiched between the lower electrode and the upper electrode; and
    a color filter formed on or above the upper electrode,
    wherein d<p where d is a distance from a lower face of the photoelectric conversion film to an upper face of the color filter and p is an arrangement pitch of the photoelectric conversion element.

2. The solid-state imaging device as claimed in claim 1, wherein the photoelectric conversion film comprises an organic photoelectric conversion material.

3. The solid-state imaging device as claimed in claim 1, wherein the photoelectric conversion film comprises an inorganic crystalline semiconductor material of direct transition type.

4. The solid-state imaging device as claimed in claim 1, wherein the photoelectric conversion film has a thickness of smaller than 3 μm.

5. The solid-state imaging device as claimed in claim 4, wherein the arrangement pitch p is less than 3 μm.

6. The solid-state imaging device as claimed in claim 1, wherein the photoelectric conversion film has a light absorption factor of 50% or more in wavelength 400 nm to 700 nm.

7. The solid-state imaging device as claimed in claim 1, wherein each of the pixel parts further comprises a protective film that protects the photoelectric conversion element, the protective film being between the upper electrode and the color filter, and
wherein the protective film has a light transmittance of 80% or more in wavelength 400 nm to 700 nm.

8. The solid-state imaging device as claimed in claim 7, wherein the protective film is formed according to an atomic layer deposition (ALD) method.

9. The solid-state imaging device as claimed in claim 7, wherein a material of the protective film comprises a metal oxide.

10. The solid-state imaging device as claimed in claim 9, wherein the metal oxide is $Al_2O_3$.

11. The solid-state imaging device as claimed in claim 9, wherein each of the pixel parts further comprises an additional protective film between the protective film and the color filter or between the protective film and the upper electrode, and wherein
the additional protective film comprises a high molecular compound.

12. The solid-state imaging device as claimed in claim 11, wherein the high molecular compound is a para-xylylene-based resin.

13. The solid-state imaging device as claimed in claim 1, wherein the upper electrode comprises any of an indium tin oxide, an indium oxide, a tin oxide, or a zinc oxide.

14. The solid-state imaging device as claimed in claim 1, wherein the color filters contained in said plurality of pixel parts are primary color filters.

15. The solid-state imaging device as claimed in claim 1, wherein the color filters contained in said plurality of pixel parts are complementary color filters.

16. The solid-state imaging device as claimed in claim 15, wherein said plurality of pixel parts comprise three or more pixel parts, and
wherein the complementary color filters are of: three types of yellow, cyan and magenta; three types of yellow, cyan and transparent; three types of yellow, transparent and magenta; three types of transparent, cyan and magenta; or four types of yellow, cyan, magenta and transparent.

17. The solid-state imaging device as claimed in claim 1, wherein the color filter comprises metal particles.

18. The solid-state imaging device as claimed in claim 17, wherein the metal particles are gold particles or sliver particles.

19. The solid-state image pickup device as claimed in claim 1,
wherein the photoelectric conversion film is a common film in the pixel parts.

20. The solid-state imaging device as claimed in claim 1, wherein the lower electrode comprises a light entry prevention part that prevents light incident and reflected from entering an adjacent pixel part.

* * * * *